United States Patent
Kim et al.

[11] Patent Number: 5,983,375
[45] Date of Patent: Nov. 9, 1999

[54] MULTI-BIT TEST CIRCUIT AND METHOD THEREOF

[75] Inventors: Hong Kim, Suwon; Ho-jin Park, Seongnam; Jong-hyun Kim; Jeon Hwangbo, both of Suwon, all of Rep. of Korea

[73] Assignee: Samsung Electronics, Co., Ltd., Suwon, Rep. of Korea

[21] Appl. No.: 08/766,116

[22] Filed: Dec. 16, 1996

[51] Int. Cl.$^6$ .................................................. G11C 29/00
[52] U.S. Cl. ..................... 714/720; 714/819; 365/201; 365/202
[58] Field of Search .................................. 371/21.3, 21.1, 371/21.2, 67.1, 68.1, 70; 365/200, 201, 202, 190

[56] References Cited

U.S. PATENT DOCUMENTS

| | | | |
|---|---|---|---|
| 4,692,901 | 9/1987 | Kumanoya et al. | 365/189.04 |
| 5,305,267 | 4/1994 | Haraguchi et al. | 365/201 |
| 5,313,430 | 5/1994 | Rawlins et al. | 365/229 |
| 5,400,281 | 3/1995 | Morigami | 365/201 |
| 5,483,493 | 1/1996 | Shin | 365/201 |
| 5,673,270 | 9/1997 | Tsujimoto | 371/21.1 |

*Primary Examiner*—Trinh L. Tu
*Attorney, Agent, or Firm*—Marger Johnson & McCollom, P.C.

[57] ABSTRACT

A multi-bit data block testing circuit and method thereof are described. The semiconductor memory device includes a multi-bit data block testing circuit for testing adjacent cell blocks using any one pattern selected from the same data pattern and a different data pattern during a multi-bit test mode. The multi-bit data block testing circuit further comprises a comparator operatively coupled to receive a data signal from each of the adjacent cell blocks. A multi-bit data block input source is interconnected with the multi-bit data block testing circuit via an input port and provides the data patterns during the multi-test mode. A multi-bit data block output receiver is interconnected with the multi-bit data block testing circuit via an output port and receives a test result indication from the comparator of the multi-bit data block testing circuit.

25 Claims, 9 Drawing Sheets

MULTI-BIT TEST CIRCUIT AND METHOD THEREOF

BACKGROUND OF THE INVENTION

The present invention relates to a semiconductor memory device, and more particularly, to a multi-bit data block testing circuit and method for selecting a bit pattern of test data from adjacent cell blocks by receiving the test data from a test data input port.

In prior art semiconductor memory devices, input/output operations are typically performed using multi-bit data blocks, that is, data which is accessed in four-bit, eight-bit, sixteen-bit, thirty two-bit and similar blocks. Also, prior art methods of simultaneously testing these multi-bit data blocks have been used to reduce the time and cost of testing multi-bit semiconductor memory devices.

A prior art multi-bit data block testing circuit and a prior art determining circuit used therein are shown in FIGS. 1 and 2, respectively, and are described further hereinbelow in the Detailed Description. Briefly, cell blocks in the semiconductor memory device under test are tested by the prior art testing circuit using integrated input/output bits. This approach leads to several problems. First, since only identical test data patterns are written into and read from the cell blocks, a failure caused by a faulty connection between bits cannot be detected. Second, the prior art determining circuit cannot detect simultaneous failures between one of two comparing pairs of data signals. For example, suppose that a failure exists in each of a first and a third cell block. When the multi-bit test data is written as "high" data values, the data signals output therefrom are asserted "low." However, the output signal from the determining circuit 30 will also be asserted "low" and the failures will go undetected.

SUMMARY OF THE INVENTION

Therefore, it is an object of the present invention to provide a multi-bit data block testing circuit and method for effectively detecting failures in a semiconductor memory device by enabling identical and different data patterns to be input to and output from cell blocks in the semiconductor memory device.

An embodiment of the present invention is a multi-bit data block testing circuit and method thereof. The semiconductor memory device includes a multi-bit data block testing circuit for testing adjacent cell blocks using any one pattern selected from the same data pattern and a different data pattern during a multi-bit test mode. The multi bit data block testing circuit further comprises a comparator operatively coupled to receive a data signal from each of the adjacent cell blocks. A multi-bit data block input source is interconnected with the multi-bit data block testing circuit via an input port and provides the data patterns during the multi-test mode. A multi-bit data block output receiver is interconnected with the multi-bit data block testing circuit via an output port and receives a test result indication from the comparator of the multi-bit data block testing circuit.

The foregoing and other objects, features and advantages of the invention will become more readily apparent from the following detailed description of a preferred embodiment of the invention which proceeds with reference to the accompanying drawings.

DETAILED DESCRIPTION OF THE INVENTION

Figure 1:
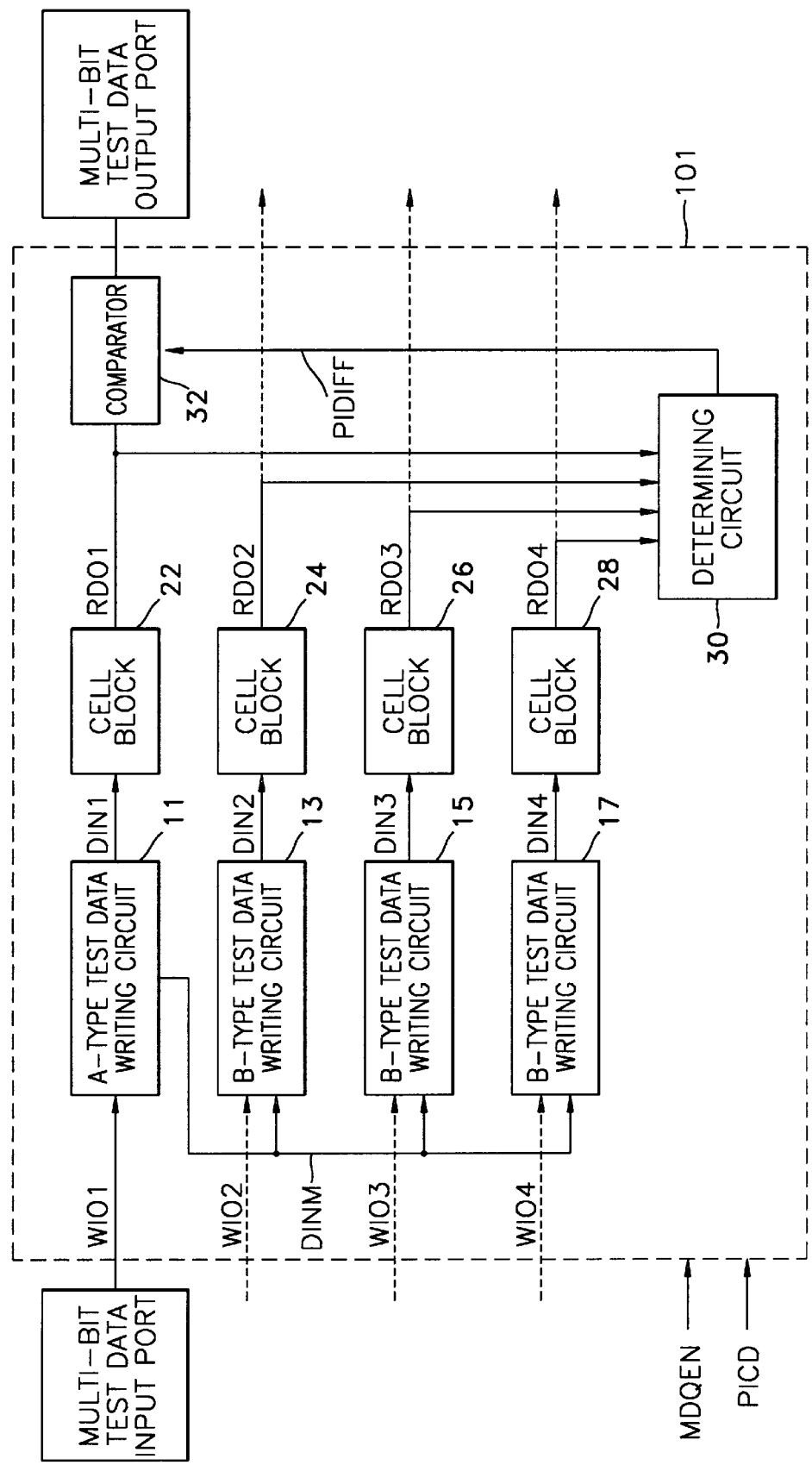
FIG. 1 is a block diagram of a prior art multi-bit data block testing circuit.

FIG. 1 is a block diagram of a prior art multi-bit data block testing circuit 101. Internal signals PICD and MDQEN from the semiconductor memory device under test are received by the testing circuit 101. Test mode signal PICD determines whether the semiconductor memory device is in a test mode. Test mode selection signal MDQEN determines whether the test mode is input per individual block or per merged block. Thus, when the test mode selection signal MDQEN is asserted "high," the inputs WIO2, WIO3 and WIO4 for enabling receipt of multi-bit test data blocks into B-type test data writing circuits 13, 15 and 17 are blocked. Multi-bit test data blocks are instead input as signals WIO1 into an A-type test data writing circuit 11 and are output as a single-bit merged signals DINM which is in turn input to the second, third and fourth cell blocks 24, 26 and 28. Each cell block 24, 26 and 28 are then tested using the associated B-type test data writing circuits 13, 15 and 17, respectively, which provide test data signals DIN2, DIN3 and DIN4.

However, when the cell blocks 24, 26 and 28 are tested using the integrated input/output bits DINM, the cell blocks 24, 26 and 28 can be tested only with an identical data pattern. Thus, by using the integrated input/output bits DINM as inputs to each cell block 24, 26 and 28, the prior art testing circuit 101 cannot detect a failure only detectable when using different data patterns and is therefore unable to detect all possible failures in the semiconductor memory device.

Figure 2:
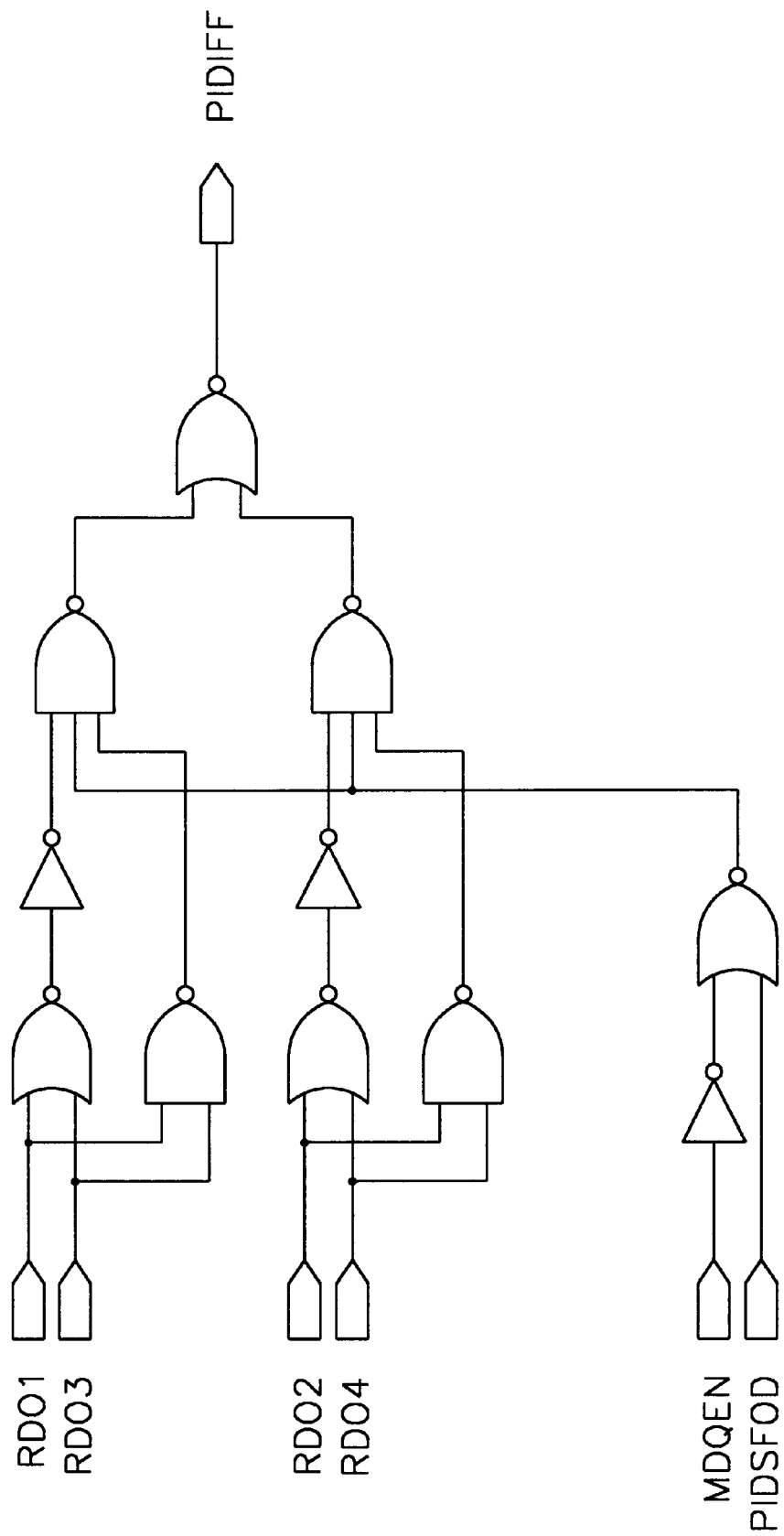
FIG. 2 is a circuit diagram of a prior art determining circuit used in the prior art testing circuit of FIG. 1.

FIG. 2 is a circuit diagram of a prior art determining circuit 30 used in the prior art testing circuit 101 of FIG. 1. The determining circuit 30 compares and determines differences in the data signals RDO1, RDO2, RDO3 and RDO4 output from the first, second, third and fourth cell blocks 22, 24, 26, 28 during testing. When all of the output data signals RDO1, RDO2, RDO3 and RDO4 are the same, an output signal PIDIFF from the determining circuit 30 is asserted "low." Conversely, when the output data signals RDO1, RDO2, RDO3 and RDO4 are not identical, the output signal PIDIFF from the determining circuit is asserted "high." When the output signal PIDIFF is asserted "high," the comparator 32 blocks the data signal RDO1 output from the first cell block 22 from being output, thereby indicating a failure.

The prior art multi-bit data block testing circuit 101 suffers from several problems. First, since only identical test data patterns are written into and read from the first, second, third and fourth cell blocks 22, 24, 26, 28, a failure caused by a faulty connection between bits cannot be detected. Second, the prior art determining circuit 30 cannot detect simultaneous failures between one of two comparing pairs of data signals RDO1 and RDO3 or RDO2 and RDO4. For example, suppose that a failure exists in each of the first and third cell blocks 22 and 26. When the multi-bit test data is written as "high" data values, the data signals RDO1 and RDO3 are asserted "low." However, the output signal PIDIFF from the determining circuit 30 will also be asserted "low" and the failures will go undetected.

Figure 3:
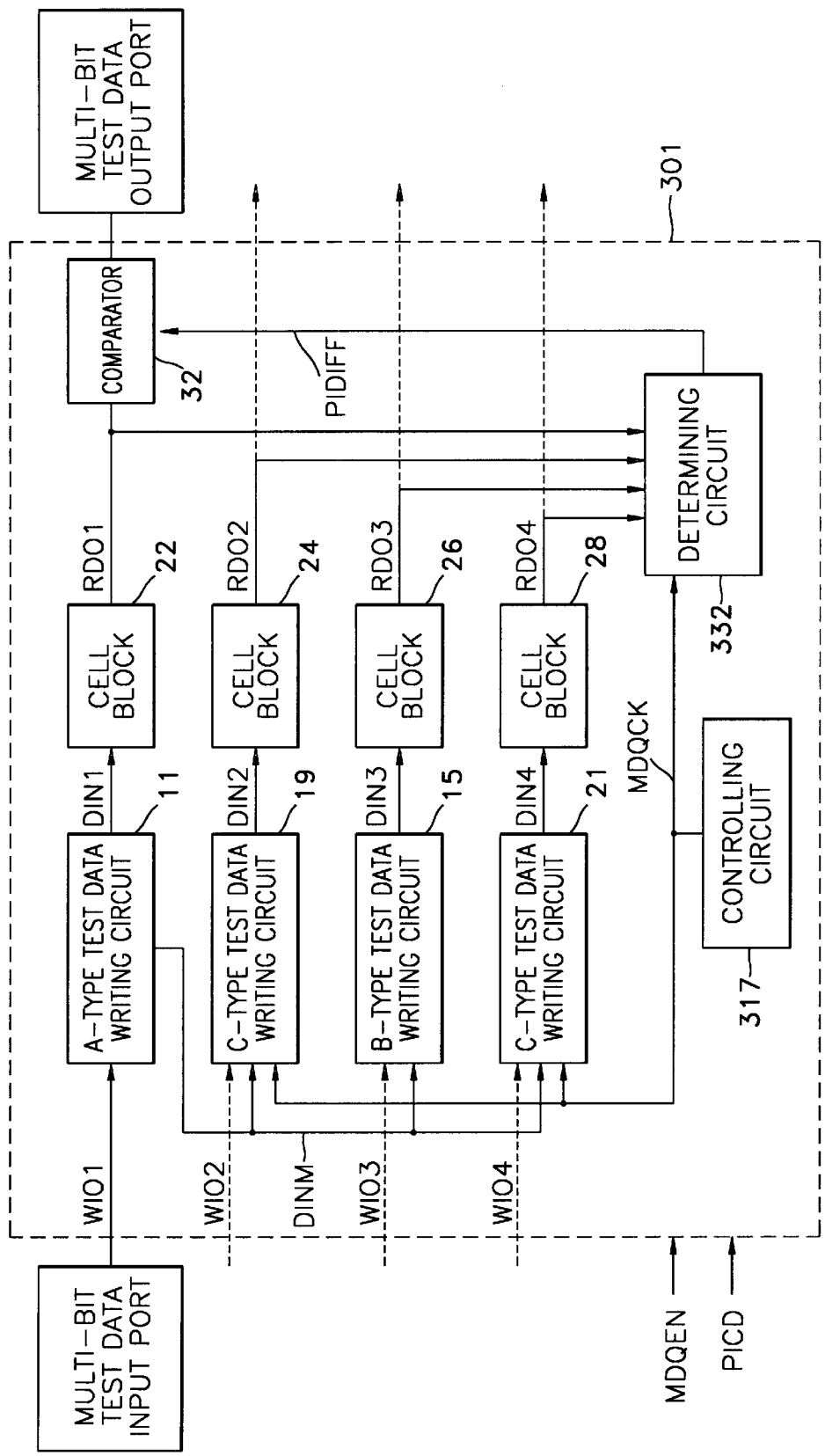
FIG. 3 is a block diagram of a multi-bit data block testing circuit constructed according to the present invention.

FIG. 3 is a block diagram of a multi-bit data block testing circuit 301 constructed according to the present invention. The testing circuit 301 includes an A-type test data writing circuit 11, a B-type test data writing circuit 15, C-type test data writing circuits 19 and 21, a controlling circuit 317 and a determining circuit 332. The A-type test data writing circuit 11, B-type test data writing circuit 15 and C-type test data writing circuits 19 and 21 are described further hereinbelow with reference to FIGS. 4, 5 and 6, respectively.

The testing circuit 301 can be set to a test mode by activating a test circuit driving signal PICD. In response, the A-type test data writing circuit 11 generates first and second output signals DIN1 and DINM having the same data pattern as the input multi-bit test data. The first output signal DIN1 is provided to a first cell block 22.

The B-type test data writing circuit 15 provides the same data pattern as the second output signals DINM from the A-type test data writing circuit 1, which is input during the multi-bit data block testing operation, to a third cell block 26. The multi-bit testing operation is performed when a test mode selection signal MDQEN is activated.

Responsive to a predetermined pattern selection signal MDQCK (shown in FIG. 6), the first C-type test data writing circuit 19 provides to a second cell block 24 either a data pattern selected from the identical data pattern or a different data pattern from that of the second output signals DINM from the A-type test data writing circuit 11 input during the multi-bit testing operation.

Also responsive to the predetermined pattern selection signal MDQCK, the second C-type test data writing circuit 21 provides to a fourth cell block 28 either a data pattern selected from the identical data pattern or a different data pattern from that of the second output DINM of the A-type test data writing circuit 11 input during the multi-bit testing operation.

Figure 7:
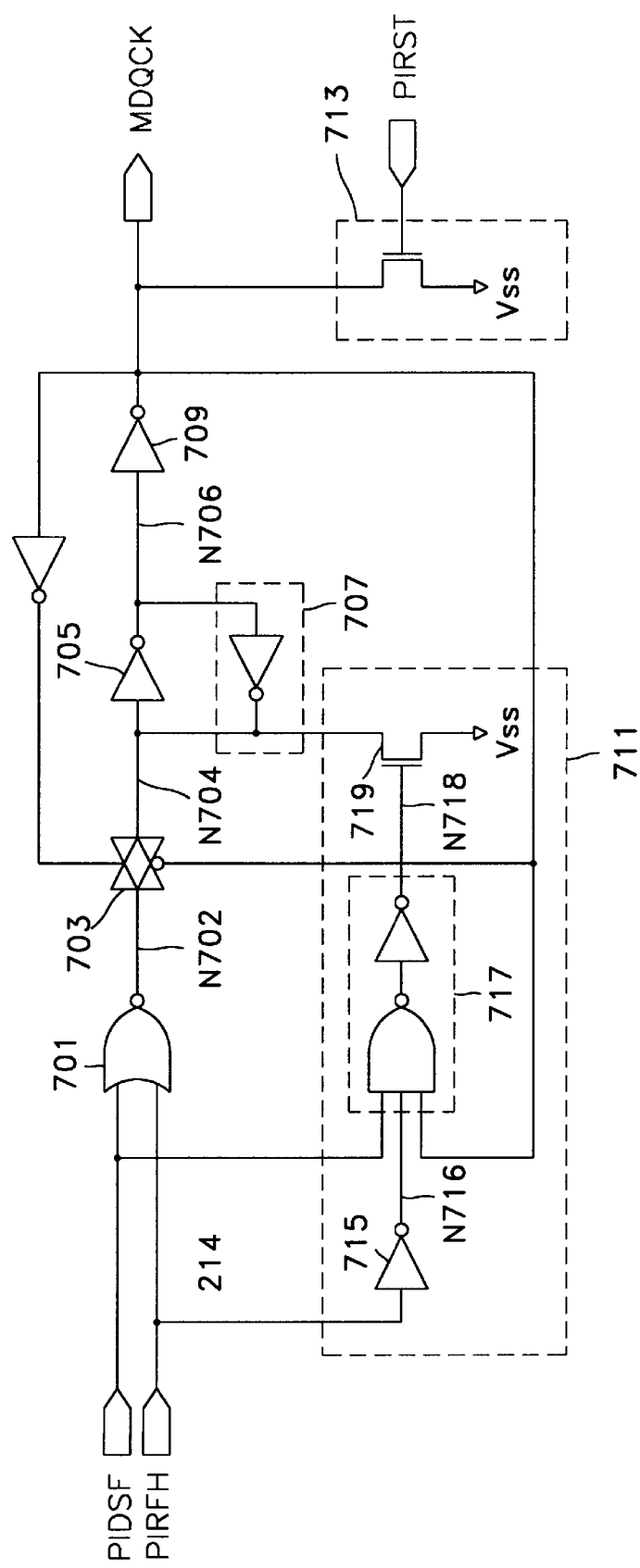
FIG. 7 is a circuit diagram of a controlling circuit used in the B-type test data writing circuit of FIG. 5.

The controlling circuit 317 is enabled by a mode information signal PIRFH (shown in FIG. 7) and outputs the pattern selection signal MDQCK in response to a control signal PIDSF (also shown in FIG. 7).

The determining circuit 332 is enabled during the multi-bit testing operation. In response to the pattern selection signal MDQCK, the determining circuit 332 compares and determines the data output from the tested cell blocks 22, 24, 26, 28.

Also, a comparator 32 compares an output signal PIDIFF from the determining circuit 332 merged with the data signal RDO1 output by testing the first cell block 22. The comparator 32 thereby blocks an output from being generated by the circuit 301 when the comparison fails. Thus, the comparator 32 indicates a test result indicating the success or failure of the test.

Figure 4:
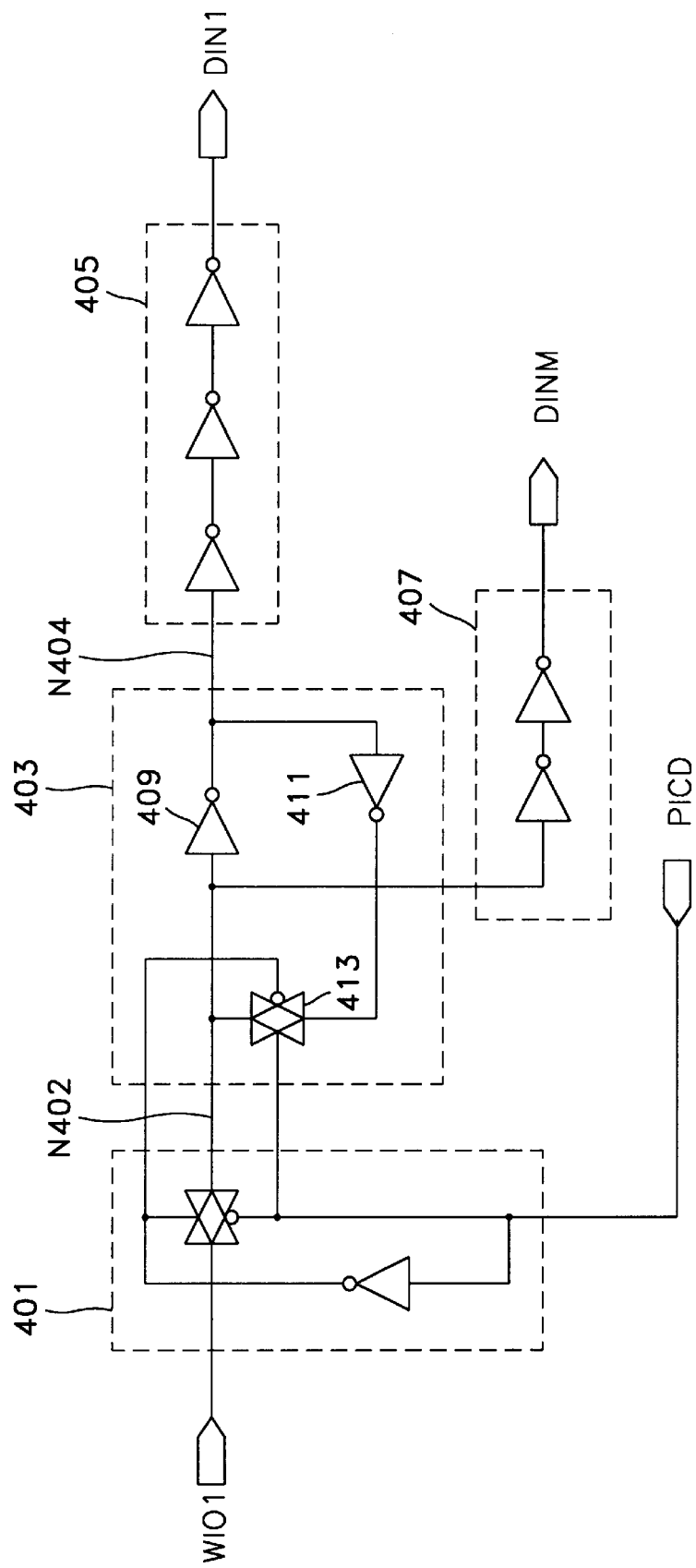
FIG. 4 is a circuit diagram of an A-type test data writing circuit used in the testing circuit of FIG. 3.

FIG. 4 is a circuit diagram of an A-type test data writing circuit 11 used in the testing circuit 301 of FIG. 3. The A-type test data writing circuit 11 includes a transmitter 401, a latch 403, and first and second buffers 405 and 407.

The transmitter 401 transmits multi-bit test data during the testing mode. When the test circuit driving signal PICD is asserted "low," the multi-bit test data is input into the A-type test data writing circuit 11 and the latch 403 latches the multi-bit test data transmitted by the transmitter 401.

The first buffer 405 buffers the latched data from the latch 403 and provides a first output signal DIN1 from the A-type test data writing circuit 11 to the first cell block 22 (shown in FIG. 3) Similarly, the second buffer 407 buffers the latched data from the latch 403 and generates a second output signals DINM from the A-type test data writing circuit 11.

The latch 403 includes first and second invertors 409 and 411 and a transmission gate 413. The first invertor 409 inverts the multi-bit test data transmitted by the transmitter 401 and generates an output signal N404 from the latch 403. The second invertor 411 inverts the output signal N404 from the first invertor 409. The transmission gate 413 transmits the output from the second invertor 411 to an input port N402 of the first invertor 409 during the test mode.

The first buffer 405 includes an inverting unit for inverting the output signal N404 from the latch 403 to generate the first output signal DIN1 from the A-type test data writing circuit 11. The second buffer 403 includes a non-inverting unit for non-inverting the multi-bit test data transmitted by the transmitter 401 to generate the second output signals DINM from the A-type test data writing circuit 11.

Thus, the A-type test data writing circuit 11 receives and latches the multi-bit test data. Data having the same pattern as the multi-bit test data is provided as the first output signal DIN1 to the first cell block 22 and as the second output signals DINM to the B-type and first and second C-type test data writing circuits 15, 19 and 21, respectively.

Figure 5:
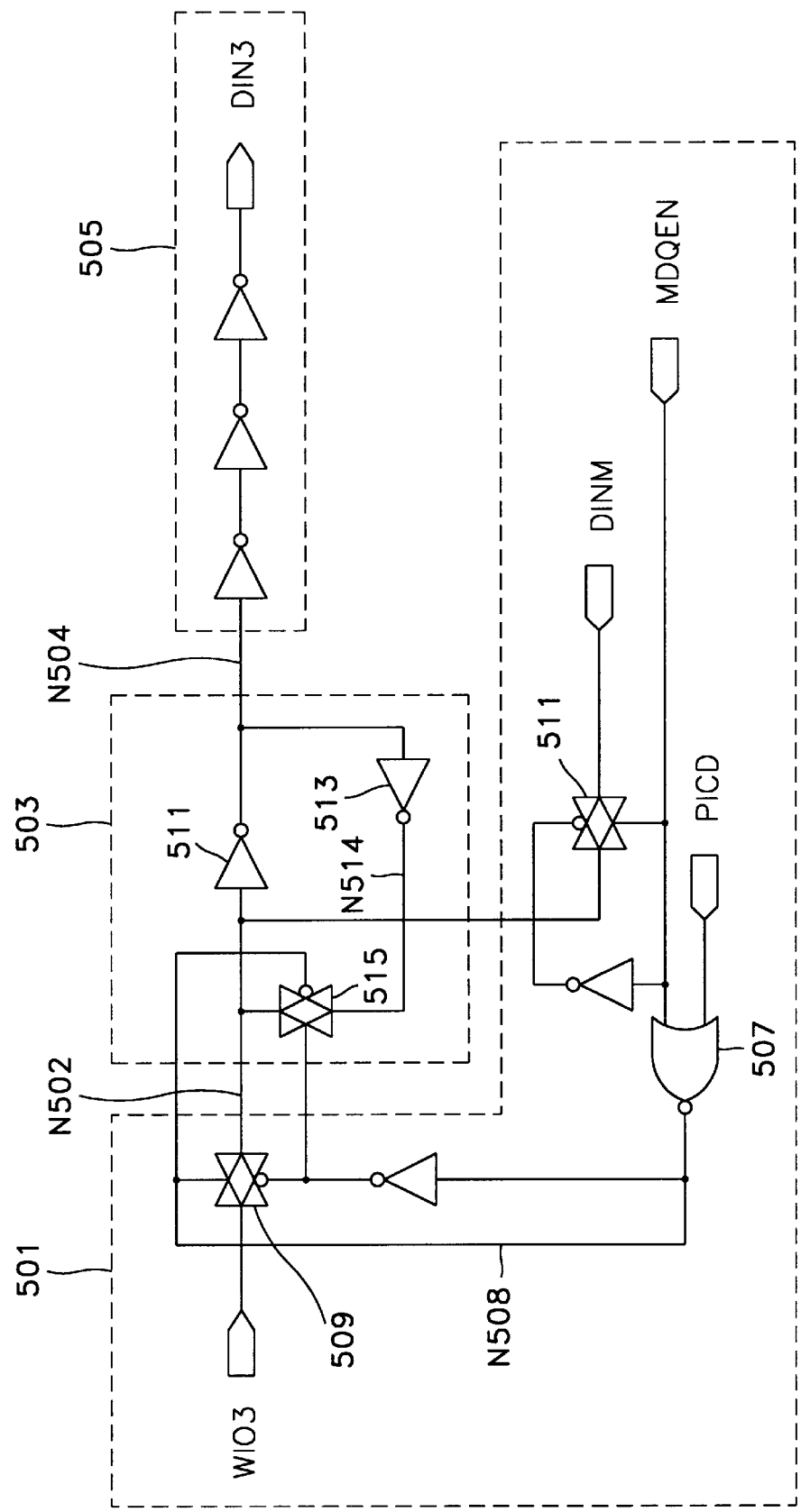
FIG. 5 is a circuit diagram of a B-type test data writing circuit used in the testing circuit of FIG. 3.

FIG. 5 is a circuit diagram of a B-type test data writing circuit 15 used in the testing circuit 301 of FIG. 3. The B-type test data writing circuit 15 includes a selector 501, a latch 503 and a buffer 505.

The selector 501 selects input data signals WIO3 during normal mode or the second output signals DINM from the A-type test data writing circuit 11 during the multi-bit testing mode. When the test mode selection signal MDQEN is asserted "high," an input path for the input data WIO3 used in the normal mode is blocked while the second output signals DINM from the A-type test data writing circuit 11 are received as input signals. Also, the latch 503 latches the data selected by the selector 501 during the multi-bit testing operation.

The buffer 505 buffers the data latched by the latch 503 to provide an output signal DIN3 to the third cell block 26 (shown in FIG. 3).

The selector 501 includes an OR invertor 507 and first and second transmission gates 509 and 511. The OR invertor 507 is enabled during the test mode and responds during the multi-bit testing mode. The first transmitter 509 transmits the input data signals WIO3 during the normal mode in response to an output signal N508 received from the OR invertor 507. The second transmission gate 511 transmits the second output signals DINM from the A-type test data writing circuit 11 during the multi-bit testing operation.

The latch 503 includes first and second invertors 511 and 513 and a second transmission gate 515. The first invertor 511 inverts the data transmitted from the transmitter 501 and generates an output signal N504 from the latch 503. The second invertor 513 inverts the output signal N504 from the first invertor 511. The second transmission gate 515 transmits an output signal N514 from the second invertor 513 to an input port N502 for the first invertor 511.

The buffer 505 includes an inverter for inverting the output signal N504 from the latch 503 and for generating an output signal DIN3 from the B-type test data writing circuit 15 to be provided to the third cell block 26 (shown in FIG. 3).

In the B-type test data writing circuit 15, when the test mode selection signal MDQEN is asserted "high" after the test circuit driving signal PICD is asserted "low," an input path for the input data signal WIO3 used during the normal mode is blocked, while the second output signals DINM from the A-type test data writing circuit 11 are received as input signals. The latch 503 latches the data selected by the selector 501 in response to the test mode selection signal MDQEN. The output signal DIN3 from the B-type test data writing circuit 13 uses the same data pattern as the multi-bit test data. Thus, the third cell block 26 is tested using the same pattern as the multi-bit test data.

Figure 6:
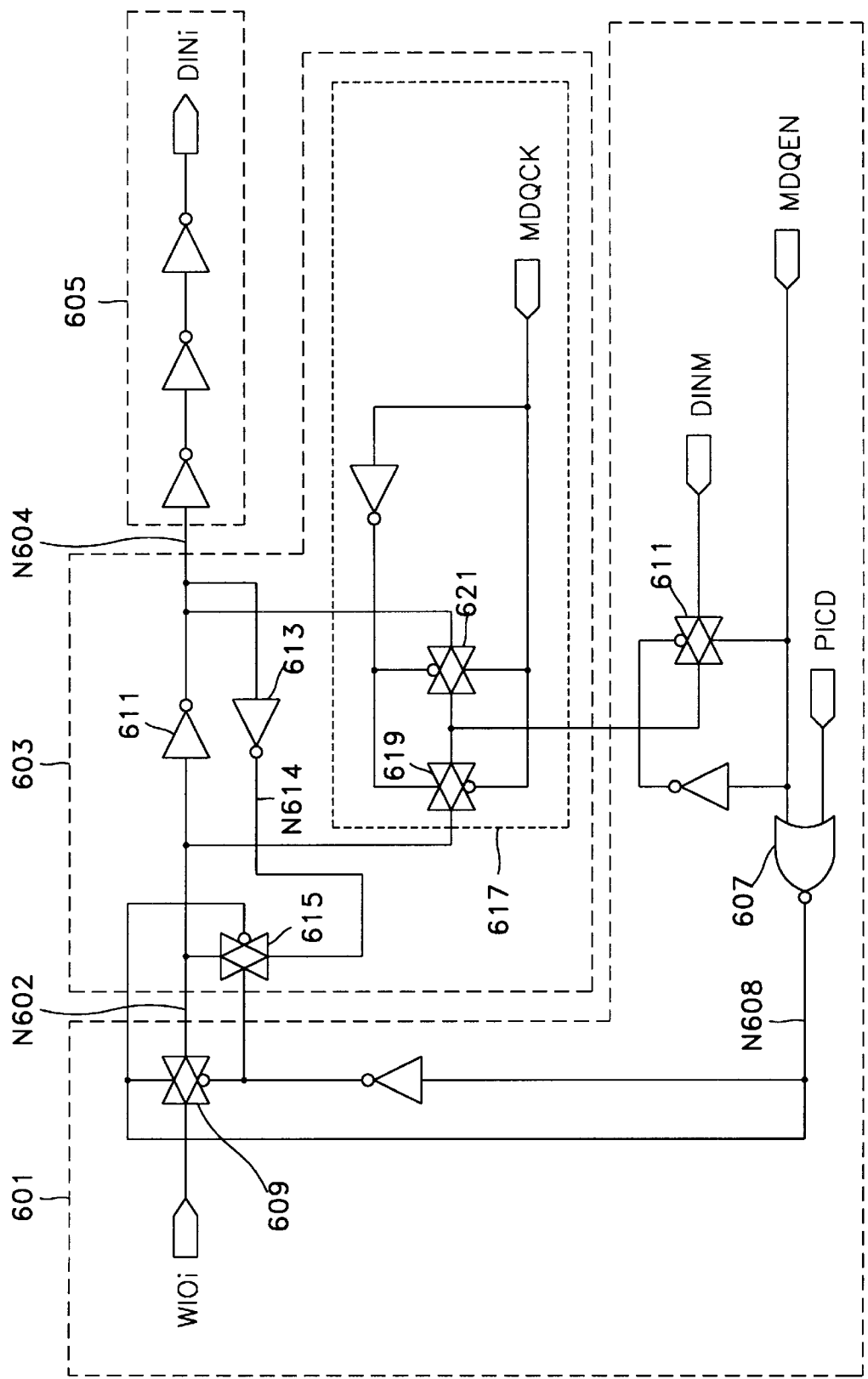
FIG. 6 is a circuit diagram of a C-type test data writing circuit used in the testing circuit of FIG. 3.

FIG. 6 is a circuit diagram of C-type test data writing circuits 19 and 21 used in the testing circuit 301 of FIG. 3. Each C-type test data writing circuit 19 and 21 include a selector 601, a latch 603 and a buffer 605.

The selector 601 selects the input data signal WIOi during normal mode or the second output DINM from the A-type test data writing circuit 11 (shown in FIG. 3) during a multi-bit testing operation. In response to the pattern selection signal MDQCK, the latch 603 selectively latches either the identical data pattern or an opposite data pattern from the second output signals DINM from the A-type test data writing circuit 11 selected by the selector 601. The buffer 605 buffers the data latched by the latch 603 to provide the output signal DINi from the C-type test data writing circuits 19 and 21.

The selector 601 includes an OR invertor 607, a first transmission gate 609 and a second transmission gate 611. The OR invertor 607 is enabled during the test mode and responds during testing.

The first transmission gate 609 transmits the input data signal WIOi during the normal mode. The second transmission gate 611 transmits the second output signals DINM from the A-type test data writing circuit 11 during multi-bit testing.

When the test mode selection signal MDQEN is asserted "high" after the test circuit driving signal PICD is asserted "low," the selector 601 blocks an input path for the input data signal WIOi used during the normal mode and inputs the second output signals DINM of the A-type test data writing circuit 11.

The latch 603 includes a first invertor 611, a second invertor 613, a second transmission gate 615 and a pattern selecting unit 617.

The first invertor 611 inverts the data selected by the selector 601 to generate an output signal N604 from the latch 603. The second invertor 613 inverts the output signal N604 from the first invertor 611. The second transmission gate 615 transmits an output signal N614 from the second invertor 613 to an input port N602 of the first invertor 611 during a test mode.

The pattern selector 617 provides the second output signals DINM from the A-type test data writing circuit 11 selectively to the input port N602 of the first invertor 611 or to the output port N604. The pattern selecting unit 617 also includes third and fourth transmission gates 619 and 621. In response to the pattern selection signal MDQCK, the third transmission gate 619 transmits the second output signals DINM from the A-type test data writing circuit 11 to the input port N602 of the first invertor 611 and the fourth transmission gate 621 transmits the second output signals DINM from the A-type test data writing circuit 11 to the output port N604 of the first invertor 611.

Accordingly, when the pattern selection signal MDQCK is asserted "low," the second output signals DINM from the A-type test data writing circuit 11 selected by the selector 601 are transmitted to the input port N602 of the first invertor 611 through the third transmission gate 619. when the pattern selection signal MDQCK is asserted "high," the second output signals DINM from the A-type test data writing circuit 11 selected by the selector 601 are transmitted to the output port N604 of the first invertor 611 through the fourth transmission gate 621.

The buffer 605 includes an invertor for inverting the output signal N604 from the latch 603 to generate an output signal DINi from the C-type test data writing circuits 19 and 21. Accordingly, when the test mode selection signal MDQEN is asserted "high," the C-type test data writing circuit 15 inputs the second output signals DINM from the A-type test data writing circuit 11. When pattern selection signal MDQCK is asserted "high," the second output signals DINM is input through the fourth transmission gate 621. Accordingly, the output signal DINi of the C-type test data writing circuit 15 will have a data pattern different from that of the DINM. Thus, when the pattern selection signal MDQCK is asserted "high," the output signal DINi will have a data pattern different from that of the multi-bit test data which tests the second and fourth cell blocks 24 and 28 (shown FIG. 3). When the pattern selection signal MDQCK is asserted "low," the second output signals DINM are input through the third transmission gate 619. Accordingly, the output signal DINi of the C-type test data writing circuit 15 will have a data pattern the same as the output signals DINM. Thus, when the pattern selection signal MDQCK is asserted "low," the output signal DINi will have a data pattern the same as the multi-bit test data which tests the second and fourth cell blocks 24 and 28.

FIG. 7 is a circuit diagram of a controlling circuit 317 used in the B-type test data writing circuit 15 of FIG. 5. The controlling circuit 317 includes an OR invertor 701, a first transmission gate 703, a first invertor 705, a latch 707, a second invertor 709, a first precharging unit 711 and a second precharging unit 713.

The OR invertor 701 is enabled by the specific mode information signal PIRFH and responds to the control signal PIDSF. In response to the output signal MDQCK of the controlling circuit 317, the first transmission gate 703 transmits an output signal N702 from the OR invertor 701. The first invertor 705 inverts the output signal N702 from the OR invertor 701 and transmits the output signal N702 to the first transmission gate 703.

The latch 707 latches the output signal N706 from the first invertor 705. The second invertor 709 generates the output signal MDQCK from the controlling circuit 317 by inverting the output signal N706 from the first invertor 705. The first precharging unit 711 precharges an input port N704 of the first invertor 705 when the test mode starts. The second precharging unit 713 precharges the output port MDQCK of the controlling circuit 317 when the test mode starts.

The first precharging unit 711 includes a third invertor 715, an AND-operation unit 717 and an NMOS transistor 719. The third invertor 715 inverts the specific mode information signal PIRFH. The AND-operation unit 717 performs a logical AND operation and outputs the control signal PIDSF, an output signal N716 from the third invertor 715 and the signal MDQCK from the output port of the controlling circuit 317. In the NMOS transistor 719, an output signal N718 from the AND-operation unit 717 is connected to a gate, the source is connected to a ground voltage Vss, and the drain is connected to the input port N704 of the first invertor 705. The second precharging unit 713 includes an NMOS transistor in which a predetermined initialization signal PIRST is connected to a gates the source is connected to a ground voltage Vss, and the drain is connected to the output port MDQCK of the controlling circuit 317.

The controlling circuit 317 according to the present embodiment enables the testing of each cell block by selectively using an identical data pattern with a different data pattern for the multi-bit test block data. The controlling circuit 317 generates the pattern selection signal MDQCK for selecting data that is the same as or is different from the multi-bit test data for testing each cell block.

The mode information signal PIRFH enables the selection of a state of the data pattern selection signal MDQCK. When the mode information signal PIRFH is asserted "low," the controlling circuit 317 is enabled. Also, the control signal PIDSF is used for selecting a state of the data pattern selection signal MDQCK. When the control signal PIDSF is asserted "high," the data pattern selection signal MDQCK is asserted "low." When the mode information signal PIDSF is asserted "low," the data pattern selection signal MDQCK is asserted "high."

The initialization signal PIRST causes the data pattern selection signal MDQCK to be asserted "low" so each cell block can be tested using the identical data at the initial stage.

In the latch 707, the data pattern selection signal MDQCK can be continuously latched by the feedback of its own signal. Once a test data pattern is determined, the data pattern selection signal MDQCK will maintain identical information until new information is input.

Figure 8:
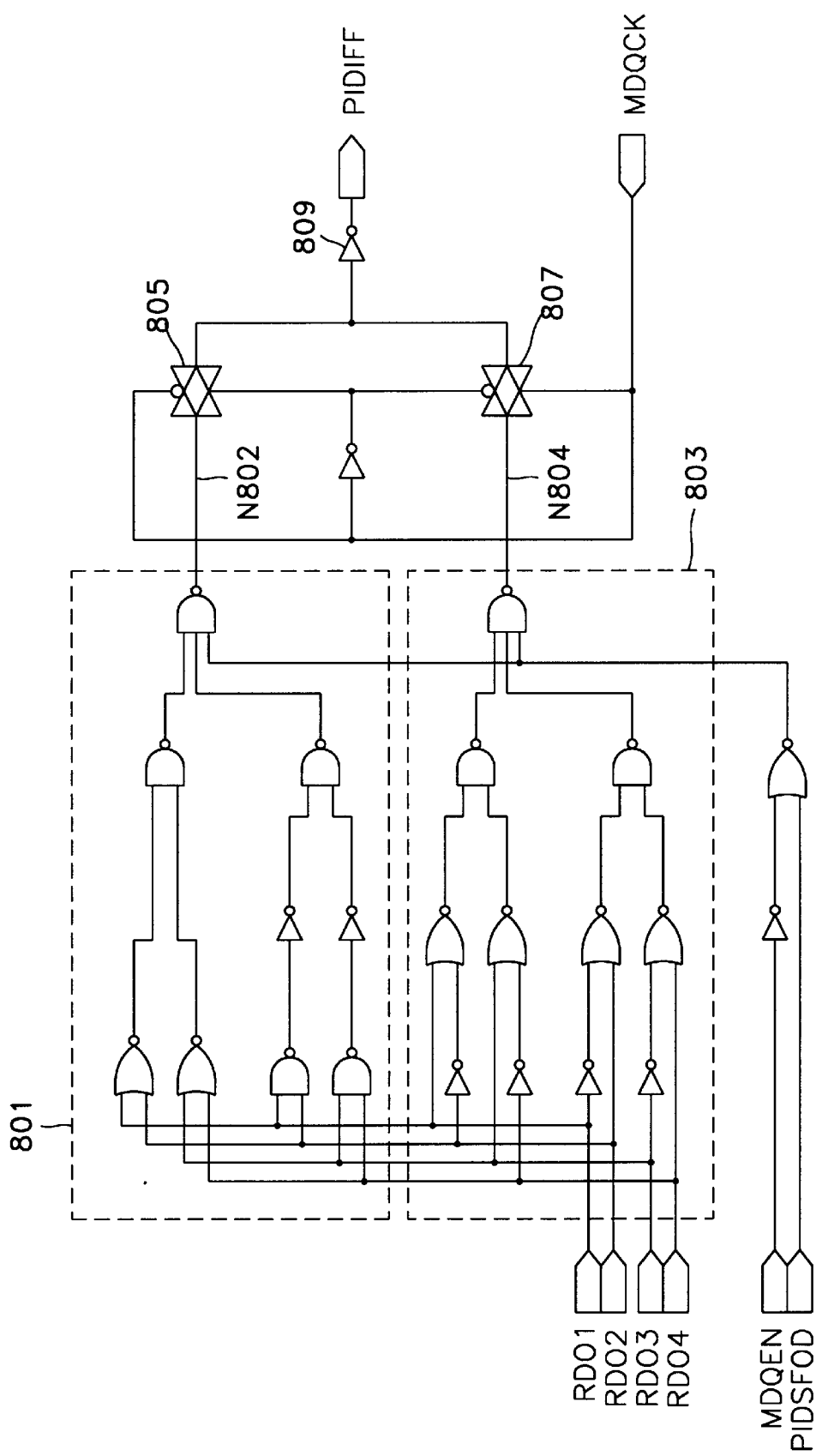
FIG. 8 is a circuit diagram of a determining circuit used in the B-type test data writing circuit of FIG. 5.

FIG. 8 is a circuit diagram of the determining circuit 330 used in the B-type test data writing circuit 15 of FIG. 5. The determining circuit 330 includes an identical-test circuit 801, an opposite-test circuit 803, a first transmission gate 805, a second transmission gate 807 and an invertor 809.

The identical-test circuit 801 is enabled during a multi-bit testing operation and responds when first and second test signals RDO1 and RDO2, having tested the first and second cell blocks 22 and 24, respectively, have the same logic state, and when third and fourth test signals RDO3 and RDO4, having tested the third and fourth cell blocks 26 and 28, respectively, have the same logic state.

The opposite-test circuit 803 is enabled during the multi-bit testing operation and responds when first and second test signals RDO1 and RDO2, having tested the first and second cell blocks 22 and 24, respectively, have opposite logic states, and when third and fourth test signals RDO3 and RDO4, having tested the third and fourth cell blocks 26 and 28, respectively, have the opposite logic states.

The first transmission gate 805 transmits an output signal N802 from the identical-test circuit 801 during a multi-bit testing operation of the identical pattern. The second transmission gate 807 transmits an output signal N804 from the opposite-test circuit 803 during the multi-bit testing of the identical pattern.

The invertor 809 selectively inverts the output signal N802 from the identical-test circuit 801 transmitted through the first transmission gate 805 or the output signal N804 from the opposite test circuit 803 transmitted through the second transmission gate 807 and generates an output signal PIDIFF from the determining circuit 330.

In the determining circuit 330 of the present invention, when the data pattern selection signal MDQCK is asserted "high" so different data patterns are selected and used in each cell block, the opposite-test circuit 803 determines whether the first and second test signals RDO1 and RDO2 and the third and fourth test signals RDO3 and RDO4 are different. If these signals are normal, the output signal PIDIFF is output as "low."

When the MDQCK signal is asserted "low" so the identical data is selected and used in each cell block, the identical-test circuit 801 determines whether the first and second test signals RDO1 and RDO2 and the third and fourth test signals RDO3 and RDO4 are the same. If these signals are normal, the output signal PIDIFF is output as "low."

If the DIN1, DIN2, DIN3 and DIN4 signals for writing multi-bit test data in the cell blocks 22, 24, 26, 28 and the test signals RDO1, RDO2, RDO3 and RDO4 as read from the cell blocks 22, 24, 26, 28 are opposite, the output signal PIDIFF is output as "low." However, if the data from RDO1 is different from the expected data, a failure exists.

Figure 9:
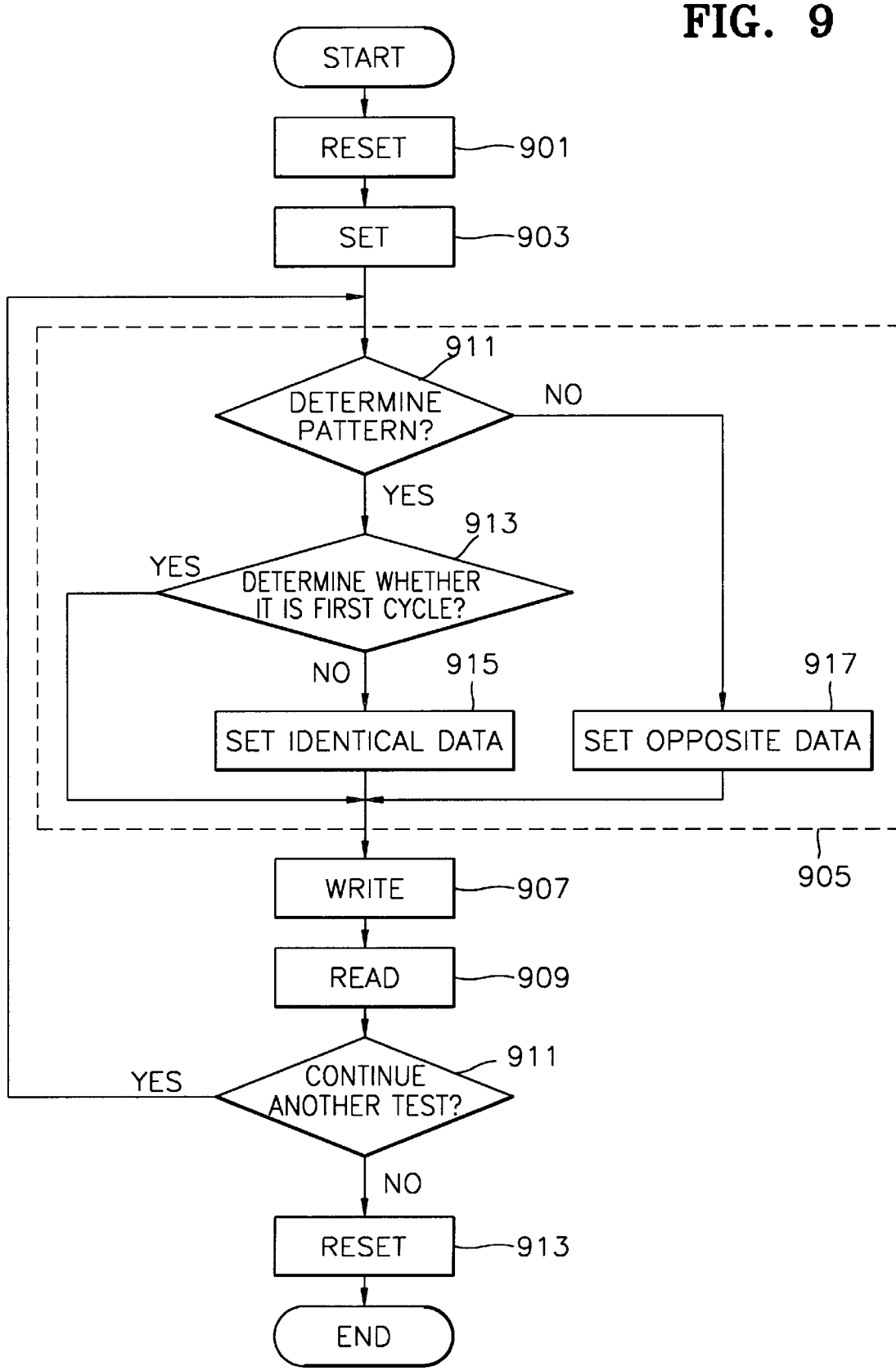
FIG. 9 is a flowchart of a test method according to the present invention using the multi-bit data block testing circuit of FIG. 3.

FIG. 9 is a flowchart of a test method according to the present invention using the multi-bit data block testing circuit 301 of FIG. 3. In step 901, the multi-bit data block testing circuit 301 is reset. In step 903, a multi-bit test mode is set. In step 905, a test data pattern is set to a multi-bit data block. In step 907, the test data set is written in the test data pattern in a cell block 22, 24, 26, 28. In step 909, the data written into the cell block 22, 24, 26, 28 is read.

The test data pattern setting step 905 includes a pattern determining step 911, an initial cycle determining step 913, an identical data setting step 915 and an opposite data setting step 917.

In step 911, whether to test identical-data is determined. In step 913, whether it is the first cycle after the multi-bit test mode setting is determined. In step 915, the identical-data to the multi-bit is set. In step 917, different data is set to the multi-bit data block.

According to the multi-bit data block testing circuit 301 and method of the present invention, identical data or opposite data can be selectively written into and read from each cell block 22, 24, 26, 28 in the semiconductor memory device under test. Therefore, the failure detection rate is substantially maximized and time and cost for testing reduced.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A semiconductor memory device having a plurality of blocks of memory cells and further comprising:

a multi-bit test data input port for receiving multi-bit test data;

a multi-bit data block testing circuit coupled to the input port to receive the multi-bit test data for selectively transmitting either the multi-bit test data, or complement multi-bit test data formed by inverting the multi-bit test data, as output signals for writing into the cell blocks during a multi-bit test mode of operation;

a determining circuit for comparing output signals read from the cell blocks and for generating an output signal indicating whether or not the output signals are consistent as among the cell blocks; and a comparator circuit arranged for comparing the output signal to the multi-bit test data, wherein said multi-bit data block testing circuit includes:

an A-type test data writing circuit having first and second outputs, both A-type test data writing circuit outputs providing the multi-bit test data and said first output being connected to provide input data to a first one of the cell blocks; and a first C-type test data writing circuit for providing to a second one of the cell blocks DINi for i=2,4, . . . a selected one of either the multi-bit test data DINM provided by the second output of said A-type test data writing circuit or complement data formed by inverting the data provided by the second output of said A-type test data writing circuit, in response to a pattern selection signal (MDQCK).

2. A semiconductor memory device as claimed in claim 1, wherein said A-type test data writing circuit comprises:

means for transmitting said multi-bit test data during the test mode;

means for latching said multi-bit test data transmitted by said transmitting means during the test mode;

first buffering means for buffering said data latched by said latching means to form the first output signal of said A-type test data writing circuit; and second buffering means for buffering said latched data to form the second output signal.

3. A semiconductor memory device as claimed in claim 2, wherein said latching means comprises:

first inverting means for inverting said multi-bit test data transmitted by said transmitting means and generating an output signal of said latching means;

second inverting means for inverting said output signal of said first inverting means; and a transmission gate for transmitting the output of said second inverting means to an input port of said first inverting means during the test mode.

4. A semiconductor memory device as claimed in claim 2, wherein said first buffering means comprises:

inverting means for inverting the output of said latching means and generating said first output signal of said A-type test data writing circuit.

5. A semiconductor memory device as claimed in claim 2, wherein said second buffering means comprises:

non-inverting means for non-inverting said multi-bit test data transmitted by said transmission means and generating said second output signal of said A-type test data writing circuit.

6. A semiconductor memory device as claimed in claim 6, wherein said first C-type test data writing circuit comprises:

means for selecting either the multi-bit test data or the complement test data during the multi-bit testing in response to said pattern selection signal;

means for latching the test data selected by said selecting means in response to said pattern selection signal; and means for buffering the test data latched by said latching means and generating an output signal of said first C-type test data writing circuit.

7. A semiconductor memory device as claimed in claim 6, wherein said selecting means comprises:

OR inverting means which is enabled when a test mode is performed and responds when a multi-bit testing is performed;

a first transmission gate for transmitting the normal mode input data WIO during the normal mode; and a second transmission gate for transmitting the second output of said A-type test data writing circuit when the multi-bit testing is performed.

8. A semiconductor memory device as claimed in claim 6, wherein said latching means comprises:

first inverting means for inverting data selected by said selecting means and generating an output signal of said latching means;

second inverting means for inverting an output of said first inverting means;

a second transmission gate for transmitting an output of said second inverting means to an input port of said first inverting means during a test mode; and pattern selecting means for selectively transmitting the second output signal of said A-type test data writing circuit either to the input port or an output port of said first inverting means according to said pattern selection signal.

9. A semiconductor memory device as claimed in claim 8, wherein said pattern selecting means comprises:

a third transmission gate for transmitting the second output signal of said A-type test data writing circuit to the input port of said first inverting means when an identical pattern multi-bit testing is performed; and a fourth transmission gate for transmitting said second output signal of said A-type test data writing circuit to the output port of said first inverting means when an opposite pattern multi-bit testing is performed.

10. A semiconductor memory device as claimed in claim 6, wherein said buffering means comprises means for inverting an output signal of said latching means and generating an output signal of said first C-type test data writing circuit.

11. A semiconductor memory device as claimed in claim 1, wherein said multi-bit data block testing circuit further comprises:

a controlling circuit, enabled by a specific mode information signal, for generating said pattern selection signal in response to a predetermined control signal.

12. A semiconductor memory device as claimed in claim 11, wherein said controlling circuit comprises:

OR inverting means which is enabled and responds to said control signal when said specific mode information signal is activated;

a first transmission gate for selectively transmitting an output signal of said OR inverting means;

first inverting means for inverting an output signal of said OR inverting means transmitted by said first transmission gate;

means for latching an output signal of said first inverting means;

second inverting means for inverting said output signal of said first inverting means and generating a pattern selection output signal of said controlling circuit;

feedback means for controlling the first transmission gate in response to the pattern selection output signal of said controlling circuit;

an output port connected to receive the pattern selection output signal of said controlling circuit;

first precharging means for precharging the input port of said first inverting means when a test mode operation starts; and second precharging means for precharging an output port of said controlling means when a test mode operation starts.

13. A semiconductor memory device as claimed in claim 12, wherein said first precharging means comprises:
    third inverting means for inverting said specific mode information signal;
    AND-operation means for performing an AND-operation of said control signal, an output signal of said third inverting means, and the pattern selection output signal; and
    an NMOS transistor in which an output signal of said AND-operation means is connected to a gate thereof, a source thereof is connected to a ground voltage, and a drain thereof is connected to an input port of said first inverting means.

14. A multi-bit data block testing circuit for a semiconductor memory device as claimed in claim 12, wherein said second precharging means comprises an NMOS transistor in which a predetermined initializing signal is connected to a gate thereof, a source thereof is connected to a ground voltage, and a drain thereof is connected to the output port of said controlling circuit.

15. A semiconductor memory device as claimed in claim 11, wherein said multi-bit data block testing circuit comprises:
    a B-type data writing circuit for providing the same data pattern to a third cell block with respect to the data pattern of the second output of said A-type test data writing circuit input during the multi-bit testing mode of operation;
    a second C-type test data writing circuit for providing to a fourth cell block a selected one of either the multi-bit test data DINM or the complement test data in response to said pattern selection signal; and
    a determining circuit, enabled during the multi-bit testing operation, for comparing and determining data output from said first, second, third and fourth cell blocks in response to said pattern selection signal.

16. A semiconductor memory device as claimed in claim 15, wherein said B-type test data writing circuit comprises:
    means for selecting normal mode input data during a normal mode or said second output of said A-type test data writing circuit during the multi-bit testing;
    means for latching data selected by said selecting means during the multi-bit testing; and
    means for buffering data latched by said latching means and generating an output signal of said B-type test data writing circuit.

17. A semiconductor memory device as claimed in claim 16, wherein said selecting means comprises:
    OR inverting means which is enabled when a test mode is performed and responds when a multi-bit testing is performed;
    a first transmission gate for transmitting the normal mode input data during a normal mode of operation; and
    a second transmission gate for transmitting a second output of said A-type test data writing circuit when the multi-bit testing is performed.

18. A semiconductor memory device as claimed in claim 16, wherein said latching means comprises:
    first inverting means for inverting data transmitted by said transmission means and generating an output signal of said latching means;
    second inverting means for inverting an output of said first inverting means; and
    a second transmission gate for transmitting an output of said second inverting means to an input port of said first inverting means when the multi-bit testing is performed.

19. A semiconductor memory device as claimed in claim 16, wherein said buffering means comprises means for inverting an output signal of said latching means and generating an output signal of said B-type test data writing circuit.

20. A semiconductor memory device as claimed in claim 15, wherein said determining circuit comprises:
    an identical testing circuit which is enabled during a multi-bit testing and responds when first and second test signals output from said first and second cell blocks, respectively, have the same logic state, and third and fourth test signals output from said third and fourth cell blocks, respectively, have the same logic state;
    a complement testing circuit which is enabled during a multi-bit testing and responds when first and second test signals output from said first and second cell blocks, respectively, have the opposite logic state to each other, and third and fourth test signals output from the third and fourth cell blocks, respectively, also have logic states opposite to each other;
    a first transmission gate for transmitting an output signal of said identical testing circuit when an identical pattern multi-bit testing is performed;
    a second transmission gate for transmitting an output signal of said opposite testing circuit when an opposite pattern multi-bit testing is performed; and
    means for inverting one selected from output signals of said identical testing circuit transmitted by said first transmission gate and said opposite testing circuit transmitted by said second transmission gate and generating an output of said determining circuit.

21. A multi-bit data block testing circuit for a semiconductor memory device having a plurality of memory cell blocks, comprising:
    input means for receiving a predetermined pattern of test data during a multi-bit testing mode of operation;
    test data writing circuits for writing to said cell blocks any one selected from the test data pattern and a complement of the test data pattern in response to a predetermined pattern selection signal;
    means for reading stored data from said cell blocks; and
    means for indicating a test result of the multi-bit testing operation responsive to the data read from said cell blocks
    wherein said test data writing circuit comprises:
        means for selecting either input data during a normal mode or said test data input during the multi-bit testing operation;
        means for selectively latching either the selected input data or complement data formed by inverting the selected input data in response to said pattern selection signal; and
        means for buffering the data latched by said latching means to form an output signal of said test data writing circuit,
    wherein said selecting means comprises:
        OR inverting means which is enabled when a test mode is performed and responds when the multi-bit testing is performed;
        a first transmission gate for transmitting the normal mode input data during a normal mode; and
        a second transmission gate for transmitting said test data.

22. A multi-bit data block testing circuit for a semiconductor memory device having a plurality of memory cell blocks, comprising:

input means for receiving a predetermined pattern of test data during a multi-bit testing mode of operation;

test data writing circuits for writing to said cell blocks any one selected from the test data pattern and a complement of the test data pattern in response to a predetermined pattern selection signal;

means for reading stored data from said cell blocks; and means for indicating a test result of the multi-bit testing operation responsive to the data read from said cell blocks wherein said test data writing circuit comprises:

means for selecting either input data during a normal mode or said test data input during the multi-bit testing operation;

means for selectively latching either the selected input data or complement data formed by inverting the selected input data in response to said pattern selection signal; and means for buffering the data latched by said latching means to form an output signal of said test data writing circuit, wherein said latching means comprises:

first inverting means for inverting data selected by said selecting means and generating an output signal of said latching means;

second inverting means for inverting an output of said first inverting means;

a second transmission gate for transmitting an output of said second inverting means to an input port of said first inverting means during a test mode; and pattern selecting means for providing said test data either to the input port or an output port of said first inverting means according to said pattern selection signal.

23. A multi-bit data block testing circuit for a semiconductor memory device as claimed in claim 22, wherein said pattern selecting means comprises:

a third transmission gate for transmitting said test data to the input port of said first inverting means when an identical pattern multi-bit testing is performed; and a fourth transmission gate for transmitting said test data to the output port of said first inverting means when an opposite pattern multi-bit testing is performed.

24. A multi-bit data block testing circuit for a semiconductor device having a plurality of cell blocks to be tested, the testing circuit being interconnected with the cell blocks and comprising:

a pattern selection signal source;

a plurality of test data writing circuits, each said cell block connected to a respective one of the test data writing circuits to receive as input a test data pattern selected in response to a pattern selection signal issued from said pattern selection signal source; and a determining circuit for comparing and determining data output from said cell blocks using one data pattern selected from either the same data pattern as the selected test data pattern or a complement data pattern to the selected test data pattern in response to said pattern selection signal, wherein said determining circuit comprises:

an identical testing circuit which is enabled during a multi-bit testing and responds when first and second test signals output from said first and second cell blocks, respectively, have the same logic state, and third and fourth test signals output from said third and fourth cell blocks, respectively, also have the same logic state;

an opposite testing circuit which is enabled during a multi-bit testing and responds when first and second test signals output from said first and second cell blocks, respectively, have opposite logic states, and third and fourth test signals output from the third and fourth cell blocks, respectively, also have opposite logic states;

a first transmission gate for transmitting an output signal of said identical testing circuit when an identical pattern multi-bit testing is performed;

a second transmission gate for transmitting an output signal of said opposite testing circuit when an opposite pattern multi-bit testing is performed; and means for inverting either the output signal of said identical testing circuit transmitted by said first transmission gate, or the output signal of said opposite testing circuit transmitted by said second transmission gate, said determining circuit generating an output responsive to said means for inverting.

25. A method for performing multi-bit data block testing of a semiconductor memory device using a multi-bit data block testing circuit, the semiconductor memory device comprising a plurality of adjacent cell blocks, the testing circuit being configured to test the adjacent cell blocks using a data pattern selected from a first test data pattern and a second test data pattern during a multi-bit test mode, comprising the steps of:

(a) resetting the multi-bit data block testing circuit;

(b) setting the testing circuit to the multi-bit test mode;

(c) initializing the first test data pattern to multi-bits;

(d) writing said first test data pattern into at least one of the cell blocks; and (e) reading said test data pattern written into the at least one cell block in said step (d) to determine a test result, wherein said step (c) comprises the substeps of:

(a-1) determining whether to test identical-data, responsive to a multi-bit control signal;

(b-1) detecting a first test cycle after said multi-bit test mode setting step (b) when testing the identical-data in said step (a-1);

(c-1) setting the identical-data to the multi-bits when the first test cycle is not detected; and (d-1) if the identical-data is not tested, inverting the multi-bits so as to form opposite data for initializing the first test data pattern.

* * * * *

UNITED STATES PATENT AND TRADEMARK OFFICE
CERTIFICATE OF CORRECTION

PATENT NO. : 5,983,375  
DATED : November 9, 1999  
INVENTOR(S) : Kim et al.

Page 1 of 1

It is certified that error appears in the above-identified patent and that said Letters Patent is hereby corrected as shown below:

<u>Title page,</u>  
Please insert the following Foreign Priority Data,  
-- 27 December 1995    [KR]   Korea    95-59525 --;

<u>Column 3,</u>  
Line 29, "circuit 1" should read -- circuit 11 --;

<u>Column 7,</u>  
Line 7, "gates the source" should read -- gate, the source --;

<u>Column 9,</u>  
Line 51, "in claim 6" should read -- in claim 1 --.

Signed and Sealed this

Ninth Day of April, 2002

Attest:

JAMES E. ROGAN  
*Attesting Officer*     *Director of the United States Patent and Trademark Office*